United States Patent
Shin

(10) Patent No.: US 8,222,971 B2
(45) Date of Patent: Jul. 17, 2012

(54) ACOUSTIC WAVE FILTER DEVICE

(75) Inventor: Yasuaki Shin, Hakusan (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 425 days.

(21) Appl. No.: 12/614,510

(22) Filed: Nov. 9, 2009

(65) Prior Publication Data

US 2010/0052807 A1 Mar. 4, 2010

Related U.S. Application Data

(63) Continuation of application No. PCT/JP2008/055411, filed on Mar. 24, 2008.

(30) Foreign Application Priority Data

May 30, 2007 (JP) .................................. 2007-143291

(51) Int. Cl.
H03H 9/64 (2006.01)
H03H 9/72 (2006.01)
(52) U.S. Cl. .......................... 333/133; 333/193; 333/195
(58) Field of Classification Search .................. 333/133, 333/193–196; 310/313 B, 313 D
See application file for complete search history.

(56) References Cited

U.S. PATENT DOCUMENTS

| | | | |
|---|---|---|---|
| 6,879,086 B2 * | 4/2005 | Takamine | 310/313 D |
| 6,985,048 B2 * | 1/2006 | Takamine et al. | 333/133 |
| 7,898,366 B2 * | 3/2011 | Yasuda | 333/195 |
| 2004/0196119 A1 * | 10/2004 | Shibahara et al. | 333/193 |
| 2007/0018756 A1 | 1/2007 | Fujii et al. | |
| 2007/0085629 A1 | 4/2007 | Kando | |
| 2007/0103254 A1 | 5/2007 | Haruta et al. | |
| 2007/0171003 A1 | 7/2007 | Takamine | |
| 2009/0261921 A1 * | 10/2009 | Moriya et al. | 333/25 |

FOREIGN PATENT DOCUMENTS

| | | |
|---|---|---|
| EP | 1 830 466 A1 | 9/2007 |
| JP | 2000-59174 A | 2/2000 |
| JP | 2001-111381 A | 4/2001 |
| JP | 2003-204241 A | 7/2003 |
| JP | 2006-254410 A | 9/2006 |
| WO | 2006/043445 A1 | 4/2006 |

OTHER PUBLICATIONS

Official Communication issued in International Patent Application No. PCT/JP2008/055411, mailed on May 20, 2008.
Official Communication issued in corresponding Japanese Patent Application No. 2009-516205, mailed on Jul. 26, 2011.

* cited by examiner

Primary Examiner — Barbara Summons
(74) Attorney, Agent, or Firm — Keating & Bennett, LLP

(57) ABSTRACT

An acoustic wave filter device includes a plurality of acoustic wave filters disposed on the same piezoelectric substrate, and achieves enlargement of out-of-passband attenuation without a large increase in its size. For at least the first acoustic wave filter, ends of second IDTs and of third IDTs connected to first and second balanced terminals, the ends being connected to a ground potential, are connected to a common connection line, the common connection line is connected to a ground terminal by a ground line, and a distance between a connection point, at which the ground line is connected to the common connection line, and the first balanced terminal, and a distance between the connection point and the second balanced terminal, is the same or substantially the same.

7 Claims, 10 Drawing Sheets

ACOUSTIC WAVE FILTER DEVICE

BACKGROUND OF THE INVENTION

1. Field of the Invention

The present invention relates to an acoustic wave filter device for use in, for example, a duplexer in a cellular phone and that includes a plurality of band-pass filters. More specifically, the present invention relates to an acoustic wave filter device in which a plurality of acoustic wave filters having an balanced-to-unbalanced transforming function are disposed on a single piezoelectric substrate.

2. Description of the Related Art

Traditionally, a surface acoustic wave filter device is widely used as a band-pass filter at an RF stage of a cellular phone or the like. To achieve miniaturization, it is preferable that a plurality of surface acoustic wave filters be formed on a single piezoelectric substrate. With this structure, the number of parts can be reduced, and the cellular phone can be further miniaturized.

At an RF stage of a cellular phone, it is preferable that a surface acoustic wave filter device also have the balanced-to-unbalanced transforming function. With this structure, a component for performing the balanced-to-unbalanced transforming function, that is, a balun, can be omitted. Accordingly, a surface acoustic wave filter device of the longitudinally-coupled resonator type having the balanced-to-unbalanced transforming function has begun to be used as a band-pass filter at the RF stage of the cellular phone.

One example of a surface acoustic wave filter device in such a use is disclosed in WO 2006/003787A1 described below.

FIG. 19 is a schematic plan view that illustrates the surface acoustic wave filter device described in WO 2006/003787A1.

A surface acoustic wave filter device 1001 includes a piezoelectric substrate 1002. A schematically illustrated electrode structure is formed on the piezoelectric substrate 1002, thus providing a first surface acoustic wave filter 1003 having the balanced-to-unbalanced transforming function and a second surface acoustic wave filter 1004 having the balanced-to-unbalanced transforming function. That is, the plurality of surface acoustic wave filters are provided on the same piezoelectric substrate 1002. For the first surface acoustic wave filter 1003, a first end of a central first IDT 1011*a* of a 3-IDT first-stage longitudinally-coupled resonator type surface acoustic wave filter portion 1011 is connected to an unbalanced terminal 1005, and a second end thereof is connected to a ground potential. First ends of second IDTs 1011*b* and 1011*c* arranged at both sides of the IDT 1011*a* are commonly connected by a line 1013 to an external ground potential.

Second ends of the second IDTs 1011*b* and 1011*c* are connected to first ends of a pair of second IDTs 1012*b* and 1012*c*, respectively, of a 3-IDT second-stage longitudinally-coupled resonator type surface acoustic wave filter portion 1012, which is connected downstream thereof. Second ends of the IDTs 1012*b* and 1012*c* are commonly connected by the line 1013 to the ground potential. A first IDT 1012*a* arranged in a central part of the second-stage longitudinally-coupled resonator type surface acoustic wave filter portion 1012 is partitioned into two parts in an acoustic wave propagation direction and thus includes first and second partitioned IDT portions 1012*a*1 and 1012*a*2. First ends of the partitioned IDT portions 1012*a*1 and 1012*a*2 are connected to first and second balanced-to-unbalanced transforming functions 1006 and 1007, respectively.

Also, for the second surface acoustic wave filter 1004 formed on the piezoelectric substrate 1002, 3-IDT longitudinally-coupled resonator type surface acoustic wave filter portions 1021 and 1022 are connected between an unbalanced terminal 1008 and first and second balanced terminals 1009 and 1010.

In this case, first ends of first IDTs 1021*a* and 1022*a* arranged in central parts of the longitudinally-coupled resonator type surface acoustic wave filter portions 1021 and 1022, respectively, are commonly connected by a line 1023 to an external ground potential. The IDT 1021*a* is connected to the first balanced terminal 1009 through a surface acoustic wave resonator 1026. The IDT 1022*a* is connected to the second balanced terminal 1010 through a surface acoustic wave resonator 1027.

First ends of second IDTs 1021*b* and 1021*c* arranged at both sides of the first IDT 1021*a* and first ends of second IDTs 1022*b* and 1022*c* arranged at both sides of the first IDT 1022*a* are commonly connected to the unbalanced terminal 1008 through a surface acoustic wave resonator 1025.

For the surface acoustic wave filter device 1001 described in WO 2006/003787A1, the plurality of surface acoustic wave filters 1003 and 1004 are provided on the same piezoelectric substrate 1002. Because the plurality of filters are formed on the same piezoelectric substrate, the number of parts can be reduced, and a cellular phone or other devices in which the surface acoustic wave filter device 1001 is accommodated can be miniaturized.

Meanwhile, for the surface acoustic wave filter device 1001, because the plurality of surface acoustic wave filters 1003 and 1004 are disposed on the same piezoelectric substrate 1002, it is preferable that the number of a plurality of lines necessary for electrical connection to the outside be minimized and the length thereof be short to achieve further miniaturization. Therefore, a plurality of lines are often commonly connected.

For example, for the surface acoustic wave filter 1003, the first ends of the IDTs 1011*b* and 1011*c* connected to the ground potential are commonly connected to a ground terminal 1031 by the above-described line 1013. The ground terminal 1031 is a terminal connected to the external ground potential. The ground terminal 1031 is disposed on the piezoelectric substrate 1002. The ground terminal 1031 is also connected to the line 1023 that is adjacent to the second surface acoustic wave filter 1004. Accordingly, typically, the ground terminal 1031 is arranged in between the plurality of surface acoustic wave filters 1003 and 1004.

As a result, for example, for the first surface acoustic wave filter 1003, the end of the IDT 1011*b* connected to the ground potential is connected to the line 1013 at a connection point 1032, and the IDT 1011*c* is connected to the line 1013 at a connection point 1033. Accordingly, the distance of the line section extending between the connection point 1032 and the ground terminal 1031 is longer than the distance of the line section extending between the connection point 1033, which is adjacent to the ground terminal 1031 and connects the second IDT 1011*c*, and the ground terminal 1031. The IDTs 1011*b* and 1011*c* are IDTs connected to the first and second balanced terminals 1006 and 1007, respectively, through the IDTs 1012*b* and 1012*c* and the first and second partitioned IDT portions 1012*a*1 and 1012*a*2, respectively, of the downstream second-stage longitudinally-coupled resonator type surface acoustic wave filter portion 1012.

The length of a ground line pattern section that achieves electrical connection between the IDT 1012*b* connected to the first balanced terminal 1006 and the above-described ground terminal 1031 is different from the length of a ground line pattern section that connects the IDT 1012*c* to the ground terminal 1031. Therefore, for the surface acoustic wave filter 1003, the degree of symmetry of the layout of the line pattern is inevitably decreased.

For this kind of the longitudinally-coupled resonator type surface acoustic wave filter device, a decrease in the degree of symmetry of the electrode and line pattern on a piezoelectric substrate tends to lead to a reduced out-of-passband attenuation in filter characteristics.

SUMMARY OF THE INVENTION

Accordingly, preferred embodiments of the present invention provide an acoustic wave filter device in which acoustic wave filters are provided on the same piezoelectric substrate and at least one of the acoustic wave filters is a longitudinally-coupled resonator type acoustic wave filter having the balanced-to-unbalanced transforming function, such that the acoustic wave filter device has a reduced size and greatly improved out-of-band attenuation characteristics.

According to a first preferred embodiment of the present invention, an acoustic wave filter device includes a piezoelectric substrate and a plurality of acoustic wave filters disposed on the piezoelectric substrate. At least one acoustic wave filter of the plurality of acoustic wave filters is a longitudinally-coupled resonator type acoustic wave filter having a balanced-to-unbalanced transforming function. The longitudinally-coupled resonator type acoustic wave filter includes an unbalanced terminal, first and second balanced terminals, a first IDT having a first end connected to the unbalanced terminal and a second end connected to a ground potential, a second IDT having a first end connected to a ground potential and a second end connected to the first balanced terminal, and a third IDT having a first end connected to the ground potential and a second end connected to the second balanced terminal. The acoustic wave filter device further includes a common connection line that is arranged to commonly connect the first ends of the second and third IDTs, the first ends being connected to the ground potential, and a ground line having a first end connected to the common connection line and a second end connected to an external ground potential. The common connection line is located on the piezoelectric substrate, and a connection point connected to the first end of the ground line is positioned such that a distance between the connection point and the first balanced terminal and a distance between the connection point and the second balanced terminal are the same or substantially the same.

The structure of the longitudinally-coupled resonator type acoustic wave filter having the balanced-to-unbalanced transforming function according to the first preferred embodiment of the present invention is not limited to a specific one. According to a particular aspect of the first preferred embodiment of the present invention, the first acoustic wave filter may include third and fourth 3-IDT longitudinally-coupled resonator type acoustic wave filter portions each having a first end connected to the unbalanced terminal. The third longitudinally-coupled resonator type acoustic wave filter portion may be a 3-IDT longitudinally-coupled resonator type acoustic wave filter portion that includes second, first, and second IDTs arranged in sequence in an acoustic wave propagation direction, and the fourth longitudinally-coupled resonator type acoustic wave filter portion may be a 3-IDT longitudinally-coupled resonator type acoustic wave filter portion that includes third, first, and third IDTs arranged in sequence in the acoustic wave propagation direction. First ends of the first IDTs of the third and fourth longitudinally-coupled resonator type acoustic wave filters may be commonly connected to the unbalanced terminal, and second ends thereof may be connected to the ground potential. First ends of the pair of the second IDTs of the third longitudinally-coupled resonator type acoustic wave filter portion may be connected to the common connection line, and second ends thereof may be commonly connected to the first balanced terminal. First ends of the pair of the third IDTs of the fourth longitudinally-coupled resonator type acoustic wave filter portion may be connected to the common connection line, and second ends thereof may be commonly connected to the second balanced terminal. In this case, the acoustic wave filter device has a structure in which the third longitudinally-coupled resonator type acoustic wave filter of the 3-IDT type and the fourth longitudinally-coupled resonator type acoustic wave filter of the same 3-IDT type are arranged in parallel with respect to the unbalanced terminal. Thus, the acoustic wave filter device having the balanced-to-unbalanced transforming function and also exhibiting an improved out-of-passband attenuation characteristic in accordance with a preferred embodiment of the present invention without a large increase in its size is obtainable.

According to a second preferred embodiment of the present invention, an acoustic wave filter device includes a piezoelectric substrate and a plurality of acoustic wave filters disposed on the piezoelectric substrate. At least one acoustic wave filter of the plurality of acoustic wave filters is a 5-IDT longitudinally-coupled resonator type acoustic wave filter having a balanced-to-unbalanced transforming function and includes first to fifth IDTs arranged in sequence along an acoustic wave propagation direction, a pair of reflectors disposed at both ends of the first to fifth IDTs in the acoustic wave propagation direction, an unbalanced terminal, and first and second balanced terminals. The third IDT includes first and second partitioned IDT portions being two portions into which the third IDT is partitioned in the acoustic wave propagation direction. First ends of the second and fourth IDTs are commonly connected to the unbalanced terminal, and second ends thereof are connected to a ground potential. First ends of the first, third, and fifth IDTs are commonly connected to a ground potential. A second end of the first IDT and the first partitioned IDT portion are commonly connected to the first balanced terminal, and a second end of the fifth IDT and the second partitioned IDT portion are commonly connected to the second balanced terminal. The acoustic wave filter device further includes a common connection line that commonly connects the first ends of the first, third, and fifth IDTs and a ground line having a first end connected to the common connection line and a second end connected to an external ground potential in order to connect the common connection line to the ground potential. The common connection line is disposed on the piezoelectric substrate, and a connection point at which the ground line is connected to the common connection line is positioned such that a distance between the connection point and the first balanced terminal and a distance between the connection point and the second balanced terminal are the same.

For the first and second preferred embodiments of the present invention, preferably, a mounting board on which the piezoelectric substrate is mounted may further be included, and the ground terminal may be disposed so as to be electrically connected to the external ground potential on the mounting board. In this case, the acoustic wave filter having a small size and high reliability can be provided by loading of the piezoelectric substrate on the mounting board by, for example, flip-chip bonding.

For the acoustic wave filter device according to a preferred embodiment of the present invention, preferably, all the plurality of acoustic wave filters disposed on the piezoelectric substrate may have the balanced-to-unbalanced transforming function, and, in all the acoustic wave filters, the distance between the connection point and the first balanced terminal and the distance between the connection point and the second balanced terminal may be the same or substantially the same. In this case, the degree of symmetry of the layout of lines in all the plurality of acoustic wave filters is high. As a result, all the acoustic wave filters exhibits a greatly improved out-of-passband attenuation characteristic.

For the acoustic wave filter device according to a preferred embodiment of the present invention, the plurality of acoustic wave filters are appropriately designed. Preferably, the plurality of acoustic wave filters may be first and second acoustic wave filters having different passbands. These first and second acoustic wave filters having different passbands can be suitably used as a reception band-pass filter for use in, for example, an RF stage of a cellular phone and a transmission band-pass filter.

For the acoustic wave filter device according to a preferred embodiment of the present invention, the acoustic wave may be a surface acoustic wave. In this case, in accordance with a preferred embodiment of the present invention, as the acoustic wave filter device, a surface acoustic wave filter device is provided.

For various preferred embodiments of the present invention, the acoustic wave filter device may further include a dielectric layer disposed on the piezoelectric substrate, and, as the above-described acoustic wave filter, a boundary acoustic wave may also be used. In this case, in accordance with a preferred embodiment of the present invention, as the acoustic wave filter device, a boundary acoustic wave filter device is preferably provided.

For the acoustic wave filter device according to the first preferred embodiment of the present invention, on the piezoelectric substrate, the ends of the second IDT connected to the first balanced terminal and of the third IDT connected to the second balanced terminal, the ends being connected to the ground potential, are commonly connected by the common connection line, and the distance between the connection point at which the ground line connected to the external ground potential is connected to the common connection line and the first balanced terminal and the distance between the connection point and the second balanced terminal are the same or substantially the same. Thus, the degree of symmetry of the layout of the line pattern at the ground-side ends of the second and third IDTs being connected to the first and second balanced terminals, respectively, is high. Because of this, in comparison with the surface acoustic wave filter device described in WO 2006/003787A1, for example, the out-of-passband attenuation can be improved.

Accordingly, with various preferred embodiments of the present invention, because the plurality of acoustic wave filters are disposed on the same piezoelectric substrate, not only the number of parts and the size of the device can be reduced, but also the out-of-passband attenuation can be enlarged.

Similarly, according to the second preferred embodiment of the present invention, at least one acoustic wave filter of the plurality of acoustic wave filters preferably is a 5-IDT longitudinally-coupled resonator type acoustic wave filter having the balanced-to-unbalanced transforming function, the first ends of the first, third, and fifth IDTs of that acoustic wave filter are commonly connected by the common connection line, and the distance between the first balanced terminal and the connection point at which the ground line connecting the common connection line to the ground potential is connected to the common connection line and the distance between the second balanced terminal and the connection point are the same. Thus, the degree of the symmetry of the layout of the line pattern of the first, third, and fifth IDTs at the ground side being connected to the ground potential is high.

Accordingly, also with the second preferred embodiment of the present invention, the out-of-passband attenuation can be made greatly improved.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

The present invention will be clarified by the description of specific preferred embodiments of the present invention below with reference to the accompanying drawings.

Figure 1:
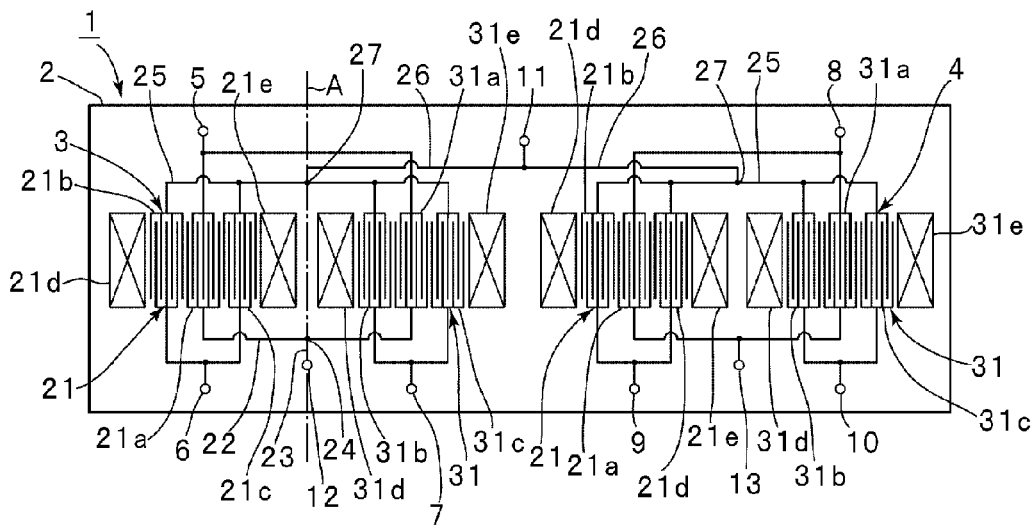
FIG. 1 is a schematic plan view of an acoustic wave filter device according to a first preferred embodiment of the present invention.
Figure 3:
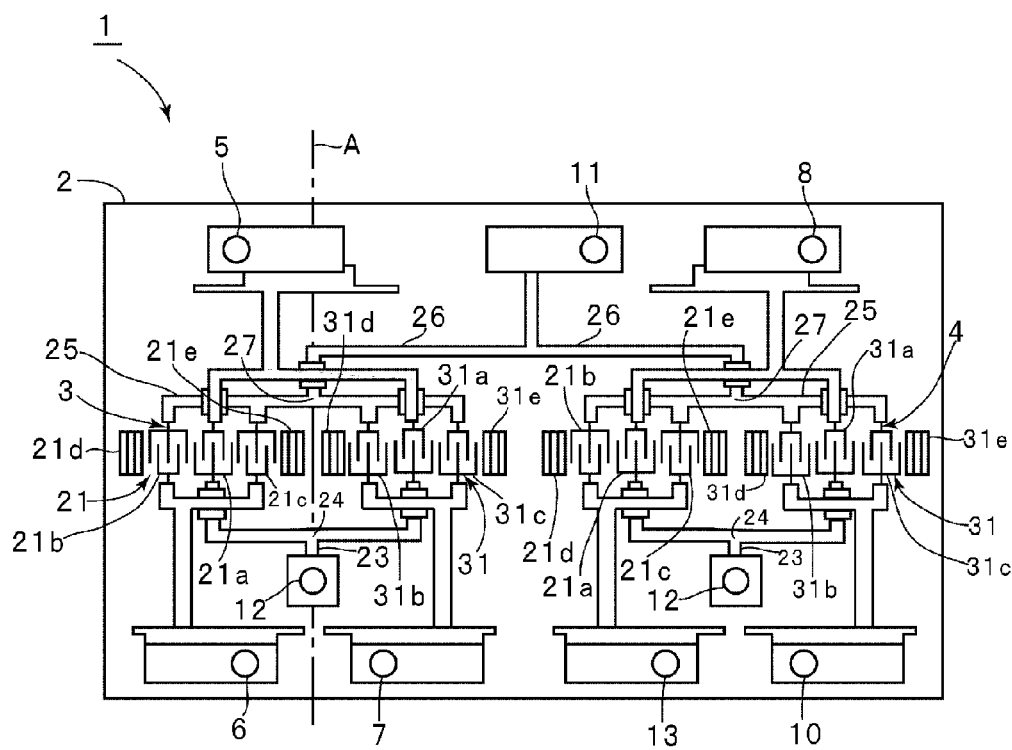
FIG. 3 is a specific plan view of the acoustic wave filter device according to the first preferred embodiment of the present invention.

FIG. 1 is a schematic plan view of an acoustic wave filter device according to a first preferred embodiment of the present invention. FIG. 3 is a plan view that more specifically illustrates an electrode structure of the acoustic wave filter device according to the present preferred embodiment.

An acoustic wave filter device 1 according to the present preferred embodiment is an acoustic wave filter device for use as a band-pass filter at an RF stage of a cellular phone.

The acoustic wave filter device 1 includes a piezoelectric substrate 2. The piezoelectric substrate 2 can be made of a piezoelectric single crystal, such as $LiTaO_3$, $LiNbO_3$, or a quartz crystal, or piezoelectric ceramic, for example.

First and second acoustic wave filters 3 and 4 as a plurality of acoustic wave filters are formed by the construction of an illustrated electrode structure on the piezoelectric substrate 2. Each of the first and second acoustic wave filters 3 and 4 preferably is a longitudinally-coupled resonator type acoustic wave filter having the balanced-to-unbalanced transforming function.

In the present preferred embodiment, the first acoustic wave filter 3 being a DCS reception filter having a pass band of, for example, about 1.805 GHz to about 1.880 GHz and the second acoustic wave filter 4 being a PCS reception filter having a pass band of, for example, about 1.930 GHz to about 1.990 GHz are disposed on the piezoelectric substrate 2.

The first acoustic wave filter 3 includes an unbalanced terminal 5 and first and second balanced terminals 6 and 7.

The second acoustic wave filter 4 includes an unbalanced terminal 8 and first and second balanced terminals 9 and 10. Ground terminals 11 to 13 connected to external ground potentials are disposed on the piezoelectric substrate 2.

In the present preferred embodiment, the first acoustic wave filter 3 includes first and second 3-IDT longitudinally-coupled resonator type surface acoustic wave filter portions 21 and 31. The first longitudinally-coupled resonator type surface acoustic wave filter portion 21 includes a first IDT 21a, a pair of second IDTs 21b and 21c arranged at both sides of the first IDT 21a in the surface acoustic wave propagation direction, and reflectors 21d and 21e arranged at both sides of a section where the IDTs 21a to 21c are disposed in the surface acoustic wave propagation direction. Similarly, the second 3-IDT longitudinally-coupled resonator type acoustic wave filter 31 includes a first IDT 31a, a pair of third IDTs 31b and 31c arranged at both sides of the first IDT 31a in the surface acoustic wave propagation direction, and reflectors 31d and 31e arranged at both sides of a section where the IDTs 31a to 31c are disposed in the surface acoustic wave propagation direction.

Here, each of the second IDTs indicates an IDT connected to the first balanced terminal 6, and each of the third IDTs 31b and 31c indicates an IDT connected to the second balanced terminal 7.

First ends of the first IDTs 21a and 31a of the first and second 3-IDT longitudinally-coupled resonator type surface acoustic wave filter portions 21 and 31, respectively, are commonly connected to the unbalanced terminal 5. Second ends of the IDTs 21a and 31a are commonly connected by a common connection line 22. The common connection line 22 is connected to the ground terminal 12 by a ground line 23. The ground line 23 is a line section that has a first end connected to the ground terminal 12 and a second end connected at a connection point 24 to the common connection line 22.

First ends of the second IDTs 21b and 21c are commonly connected by a common connection line 25. The common connection line 25 is also connected to first ends of the third IDTs 31b and 31c. That is, the first ends of the IDTs 21b, 21c, 31b, and 31c are commonly connected by the single common connection line 25. The common connection line 25 is connected at a connection point 27 to a first end of a ground line 26. A second end of the ground line 26 is connected to the ground terminal 11. The connection point 27 corresponds to a connection point that connects, to the ground line 26 connected to an external ground potential, the ends of the second IDTs 21b and 21c and of third IDTs 31b and 31c, which are connected to the first and second balanced terminals, respectively, the ends being connected to the ground potential.

Second ends of the second IDTs 21b and 21c are commonly connected to the first balanced terminal 6.

Second ends of the third IDTs 31b and 31c are also commonly connected to the second balanced terminal 7.

Also for the second acoustic wave filter portion 4, in the present preferred embodiment, first and second 3-IDT longitudinally-coupled resonator type surface acoustic wave filter portions 21 and 31 are provided, as in the first acoustic wave filter portion 3. Accordingly, the same reference numerals are used for the same parts, thereby omitting the description thereof.

One of the unique features of the acoustic wave filter device 1 according to the present preferred embodiment is that the degree of symmetry of the layout of the ground line pattern for connecting, to the ground potential, the second ends of the second IDTs 21b and 21c connected to the first balanced terminal 6 and the second ends of the third IDTs 31b and 31c connected to the second balanced terminal 7 is enhanced. In other words, the ground line 26 is connected to the connection point 27, and the connection point 27 is positioned such that the distance between the connection point 27 and the first balanced terminal 6 is the same as, or substantially the same as, the distance between the connection point 27 and the second balanced terminal 7. In other words, the connection point 27 is positioned on an imaginary line 'A' passing through the center of the first acoustic wave filter portion 3 on the piezoelectric substrate 2, that is, on the imaginary line A passing through the center between the first and second longitudinally-coupled resonator type surface acoustic wave filter portions 21 and 31.

Accordingly, the line pattern section for connecting, to the ground line 26, the second IDTs 21b and 21c connected to the first balanced terminal 6 and the ground line section for connecting, to the ground line 26, the third IDTs 31b and 31c are symmetric with respect to the imaginary line A. Accordingly, the degree of symmetry of the layout of the ground line pattern section is enhanced, so the out-of-passband attenuation is improved.

Figure 2:
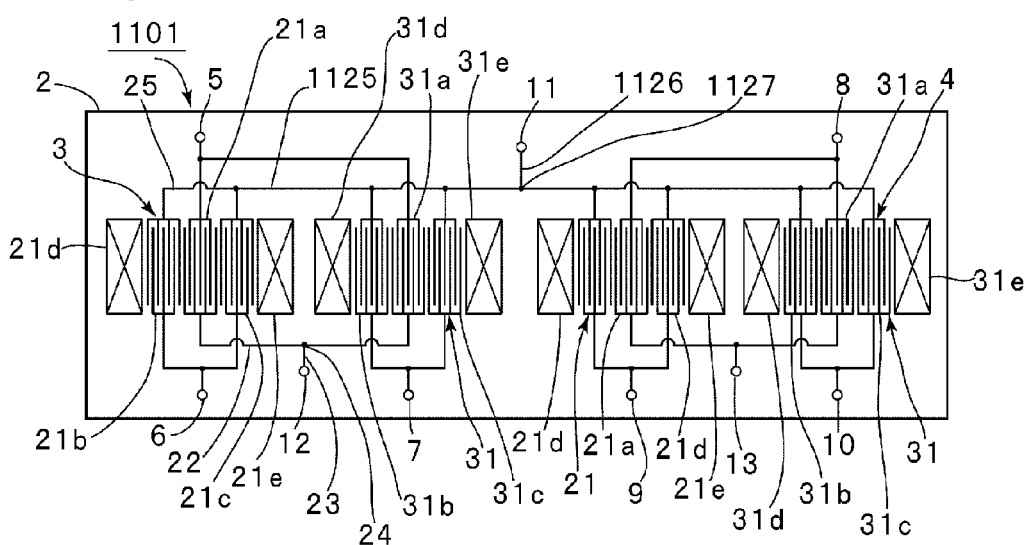
FIG. 2 is a schematic plan view of an acoustic wave filter device according to a comparative example prepared for comparison with the first preferred embodiment of the present invention.

This will be clarified by the comparison with a comparative example illustrated in FIG. 2.

FIG. 2 is a schematic plan view of an acoustic wave filter device 1101 prepared as a comparative example for the acoustic wave filter device in the first preferred embodiment.

For the acoustic wave filter device 1101, similar to the above preferred embodiment, the first and second acoustic wave filters 3 and 4 are disposed on the same piezoelectric substrate 2. A difference is that the ends of the second IDTs 21b and 21c, which are connected to the first balanced terminal 6, the ends being connected to the ground potential, and the ends of the third IDTs 31b and 31c, which are connected to the second balanced terminal 7, the ends being connected to the ground potential, are commonly connected by a common connection line 1125, and the common connection line 1125 and a ground line 1126 are connected at a connection point 1127. That is, for the acoustic wave filter device 1101, in order to shorten the length of routing of the line pattern connected to the ground potential, on the piezoelectric substrate 2, the ends of the IDTs 21b, 21c, 31b, and 31c, the ends being connected to the ground potential, are connected to the ground terminal 11 disposed between the acoustic wave filter 3 and the other acoustic wave filter 4 by the common connection line 1125 and the ground line 1126. Thus, the connection point 1127 is positioned adjacent to the ground terminal 11. Here, the common connection line indicates a line section that commonly connects the ends of the IDTs 21b, 21c, 31b, and 31c, the ends being connected to the ground potential; in FIGS. 1 and 2, it corresponds to a line section that commonly connects the ends of the IDTs 21b, 21c, 31b, and 31c, the ends being arranged adjacent to the unbalanced terminal 5. The ground line indicates a line pattern that electrically connects the ground terminal 11 and the above-described common connection line.

As is clear from the comparison between FIGS. 1 and 2, in FIG. 2, because the common connection line 1125 and the ground line 1126 are provided, as described above, the length of the line pattern positioned adjacent to the unbalanced terminal 5 can be reduced. In contrast to this, in the preferred embodiment illustrated in FIG. 1, because the ground line 26 is connected to the common connection line 25 at the connection point 27, the length of the line pattern for the IDTs 21b, 21c, 31b, and 31c that is adjacent to the unbalanced terminal 5 and that is connected to the ground potential is long. However, in the present preferred embodiment, in comparison with the acoustic wave filter device 1101 according to the comparative example illustrated in FIG. 2, the degree of symmetry of the layout of the ground line patterns described above is higher. Therefore, the out-of-passband attenuation can be improved. This will be described with reference to FIGS. 4 to 9.

Figure 4:
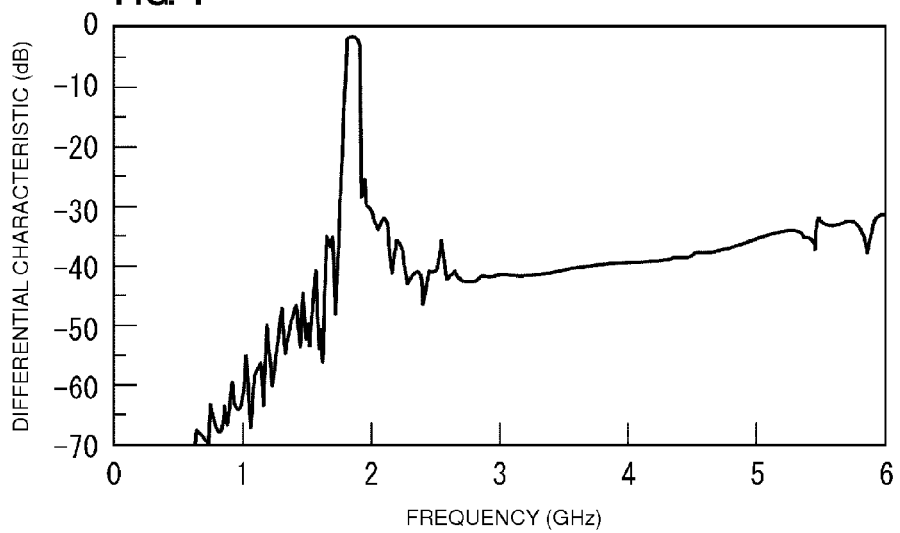
FIG. 4 illustrates a differential characteristic of a first acoustic wave filter in the acoustic wave filter device according to the comparative example shown in FIG. 2.
Figure 6:
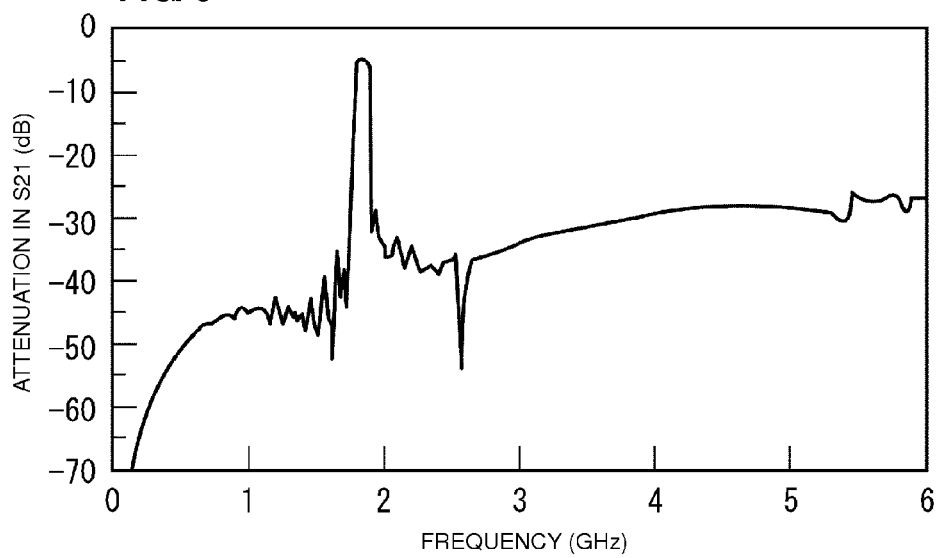
FIG. 6 illustrates an attenuation-frequency characteristic in S21 of the first acoustic wave filter in the acoustic wave filter device according to the comparative example shown in FIG. 2.
Figure 8:
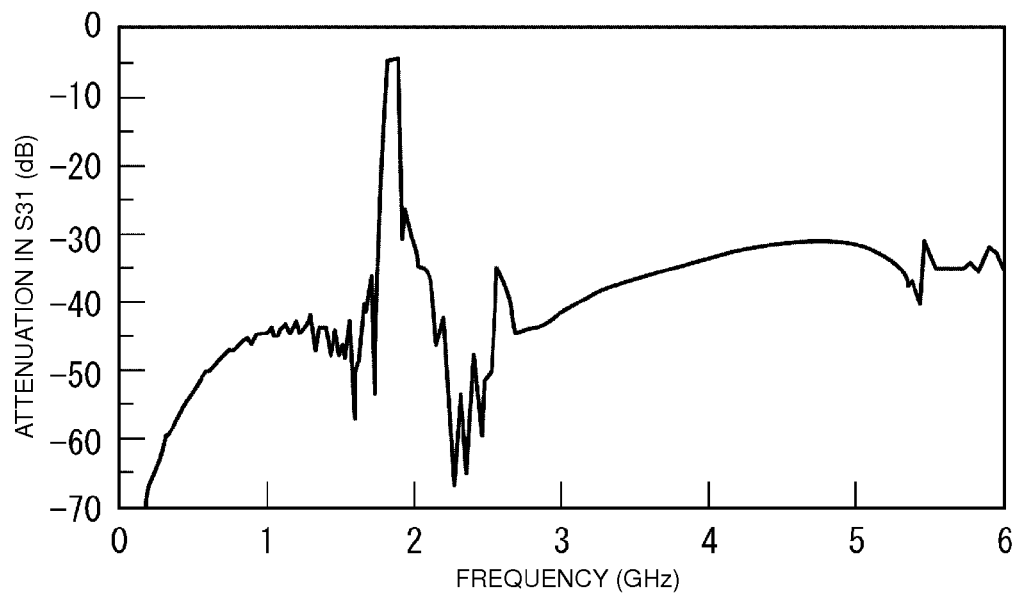
FIG. 8 illustrates an attenuation-frequency characteristic in S31 of the first acoustic wave filter in the acoustic wave filter device according to the comparative example shown in FIG. 2.

FIGS. 4, and 6 and 8 illustrate, in the comparative example illustrated in FIG. 2, a differential characteristic of the first acoustic wave filter between the first and second balanced terminals and a difference between an attenuation characteristic in the first balanced terminal, that is, S21 and an attenuation characteristic in the second balanced terminal, that is, S31, respectively; FIG. 6 illustrates an attenuation characteristic in S21 and FIG. 8 illustrates an attenuation characteristic in S31.

Figure 5:
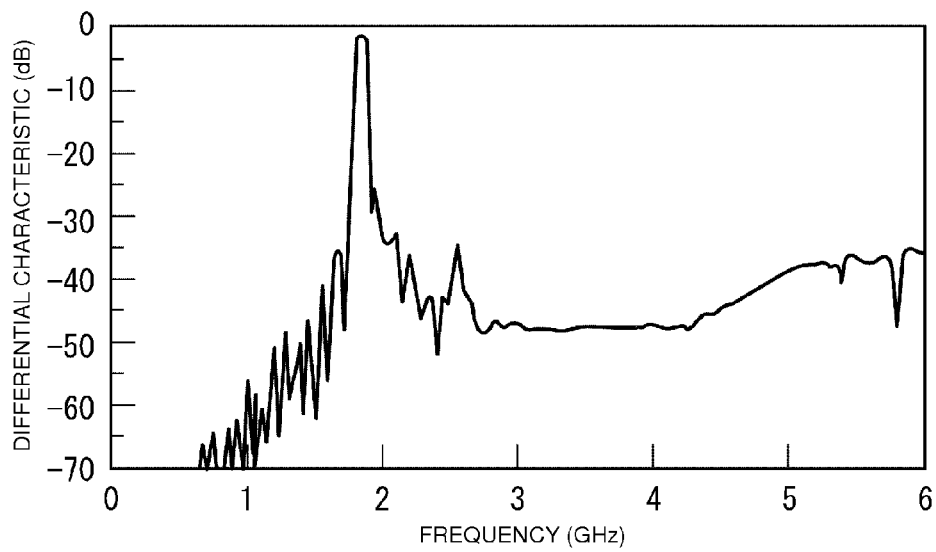
FIG. 5 illustrates a differential characteristic of a first acoustic wave filter in the acoustic wave filter device according to the first preferred embodiment shown in FIG. 1.
Figure 7:
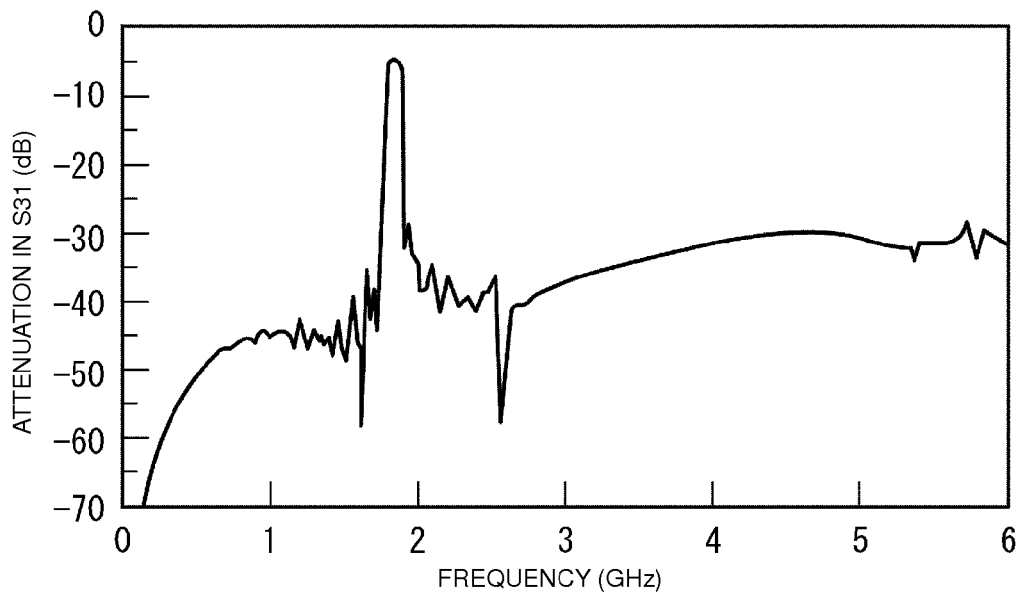
FIG. 7 illustrates an attenuation-frequency characteristic in S21 of the first acoustic wave filter in the acoustic wave filter device according to the first preferred embodiment shown in FIG. 1.
Figure 9:
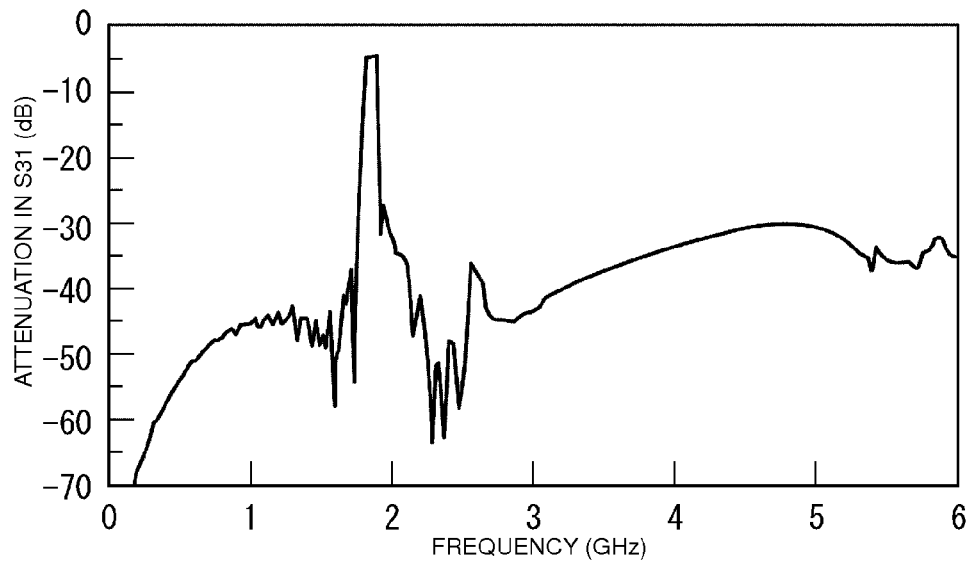
FIG. 9 illustrates an attenuation-frequency characteristic in S31 of the first acoustic wave filter in the acoustic wave filter device according to the first preferred embodiment shown in FIG. 1.

In contrast to this, FIG. 5 illustrates a differential characteristic in between the first and second balanced terminals in the above preferred embodiment; FIG. 7 illustrates an attenuation characteristic in the first balanced terminal, that is, S21;

FIG. 9 illustrates an attenuation-frequency characteristic in the second balanced terminal, that is, S31.

As is clear from the comparison between FIGS. 4, 6, and 8 and FIGS. 5, 7, and 9, in the above preferred embodiment, in the differential characteristic, at about 3 GHz to about 6 GHz, for example, which is an out-of-passband range, the attenuation characteristic is improved by approximately 5 db to 10 dB, in comparison with the comparative example.

For the acoustic wave filter device 3 according to the above preferred embodiment, the ground line section is provided in the second acoustic wave filter 4, similar to in the first acoustic wave filter 3. In the comparative example, as illustrated in FIG. 2, the ground-side line pattern in the second acoustic wave filter is arranged, similar to the arrangement in the first acoustic wave filter.

Figure 10:
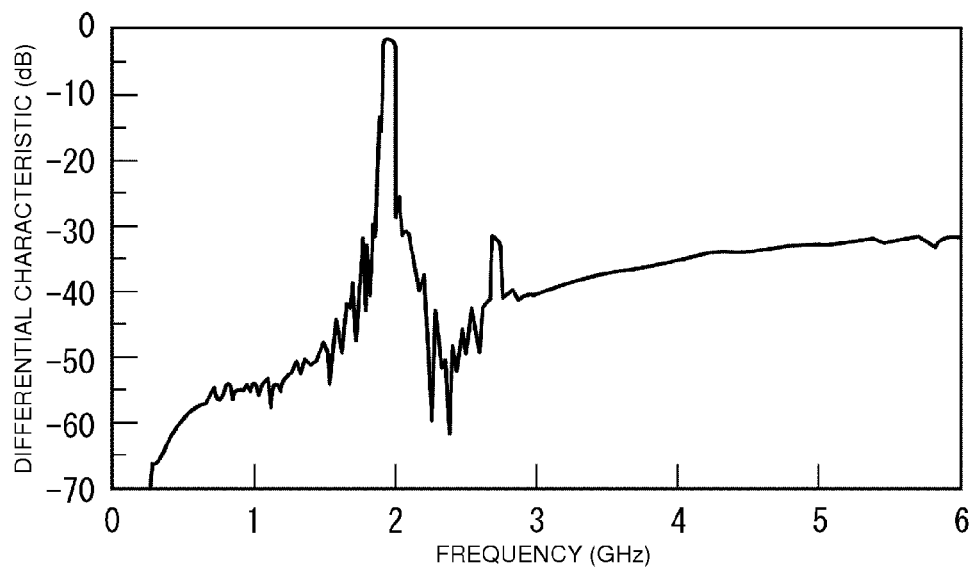
FIG. 10 illustrates a differential characteristic of a second acoustic wave filter in the acoustic wave filter device according to the comparative example shown in FIG. 2.
Figure 11:
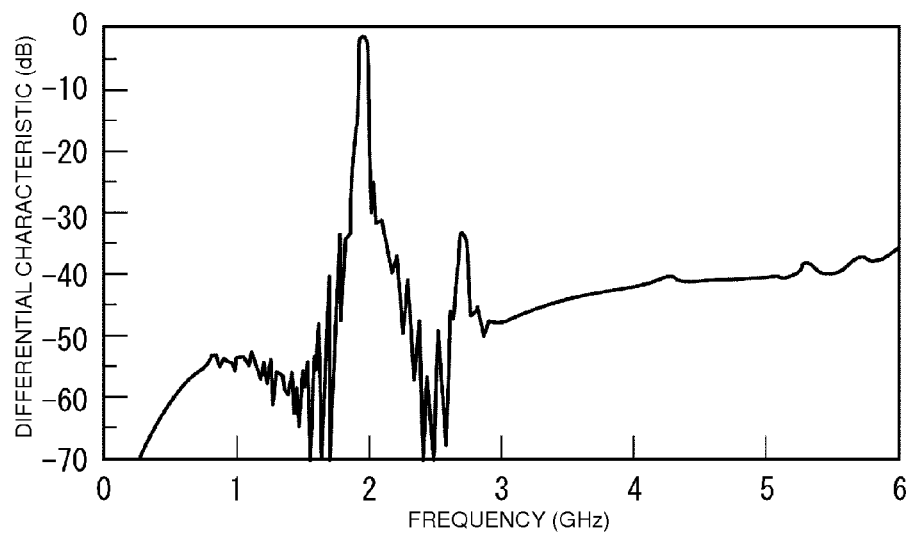
FIG. 11 illustrates a differential characteristic of a second acoustic wave filter in the acoustic wave filter device according to the first preferred embodiment shown in FIG. 1.
Figure 12:
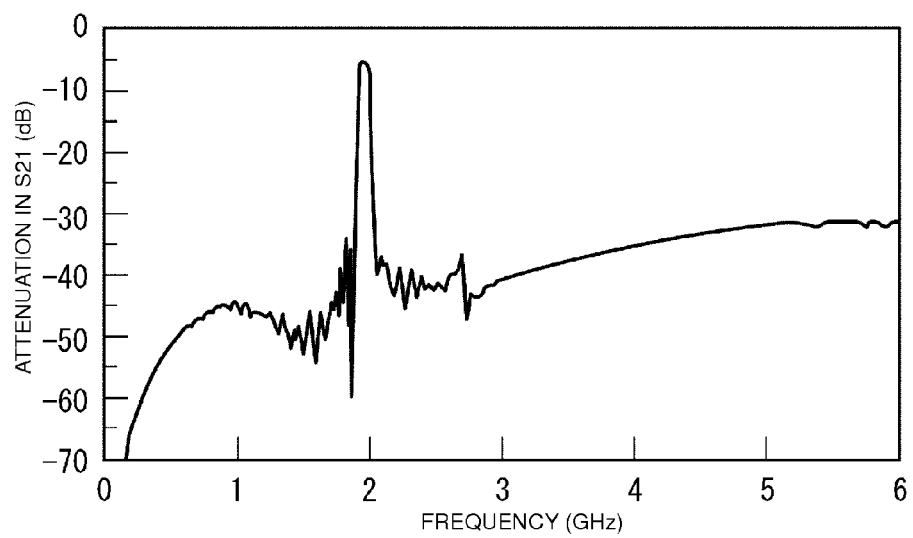
FIG. 12 illustrates an attenuation-frequency characteristic in S21 of the second acoustic wave filter in the acoustic wave filter device according to the comparative example shown in FIG. 2.
Figure 13:
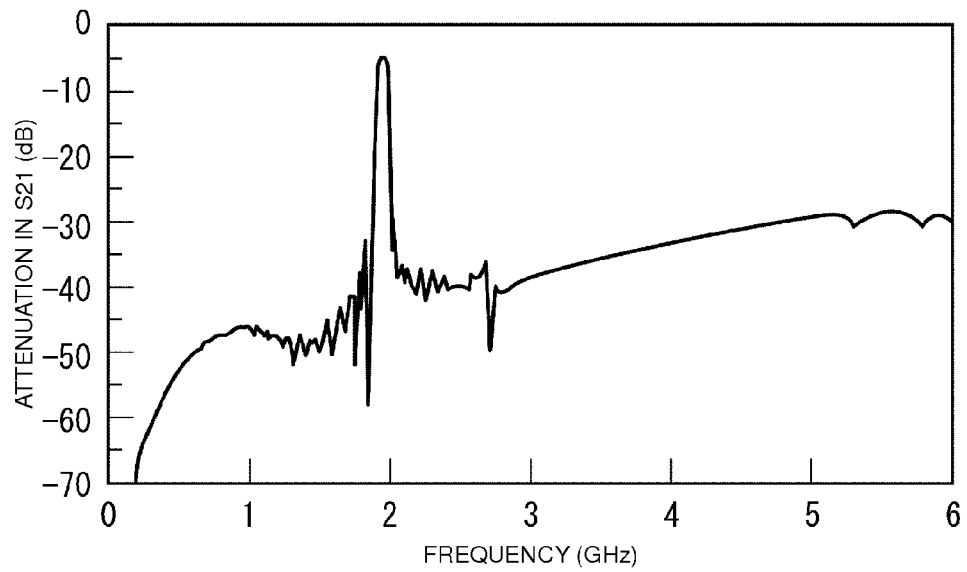
FIG. 13 illustrates an attenuation-frequency characteristic in S21 of the second acoustic wave filter in the acoustic wave filter device according to the first preferred embodiment shown in FIG. 1.
Figure 14:
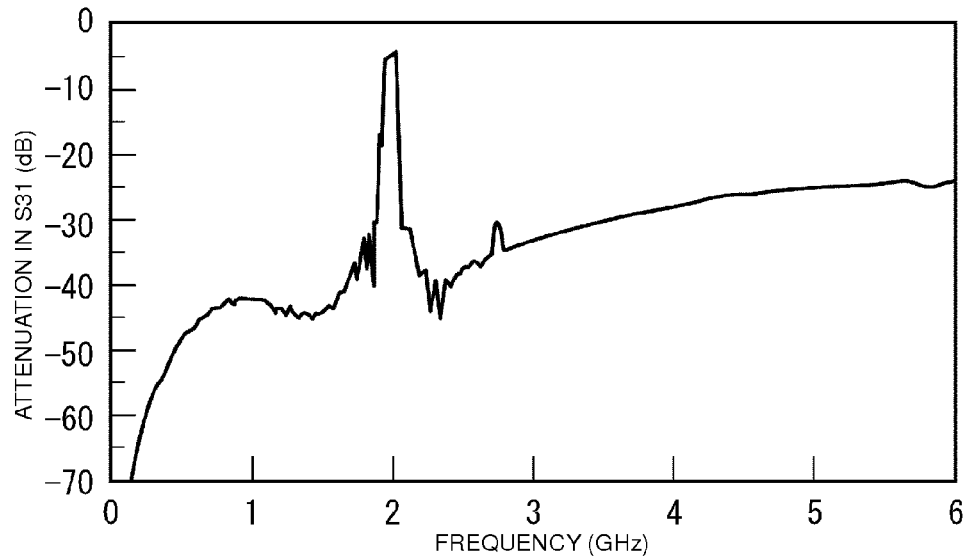
FIG. 14 illustrates an attenuation-frequency characteristic in S31 of the second acoustic wave filter in the acoustic wave filter device according to the comparative example shown in FIG. 2.
Figure 15:
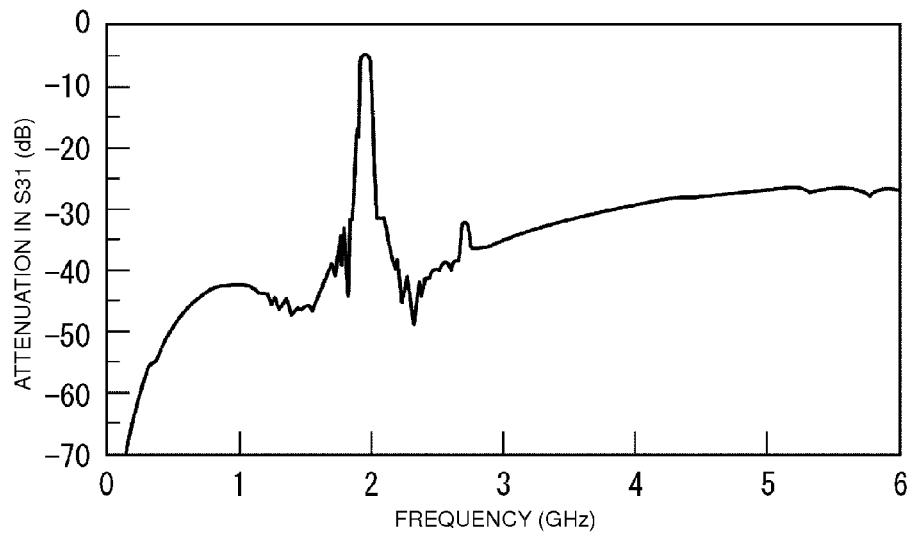
FIG. 15 illustrates an attenuation-frequency characteristic in S31 of the second acoustic wave filter in the acoustic wave filter device according to the first preferred embodiment shown in FIG. 1.

FIG. 10 illustrates a differential characteristic of the second acoustic wave filter according to the comparative example, FIG. 12 illustrates an attenuation-frequency characteristic in the first balanced terminal, that is, S21 thereof, and FIG. 14 illustrates an attenuation-frequency characteristic in the second balanced terminal, that is, S31 thereof. FIG. 11 illustrates a differential characteristic of the second acoustic wave filter 4 according to the first preferred embodiment, FIG. 13 illustrates an attenuation-frequency characteristic in the first balanced terminal, that is, S21 thereof, and FIG. 15 illustrates an attenuation-frequency characteristic in the second balanced terminal, that is, S31 thereof.

As is clear from the comparison between FIGS. 10, 12, and 14 and FIGS. 11, 13, and 15, also in the second acoustic wave filter 4, which is a PCS reception filter, the attenuation in a frequency range of about 3 GHz to about 6 GHz, for example, which is an out-of-passband range, is improved by approximately 5 to 10 dB, in comparison with the comparative example.

Figure 16:
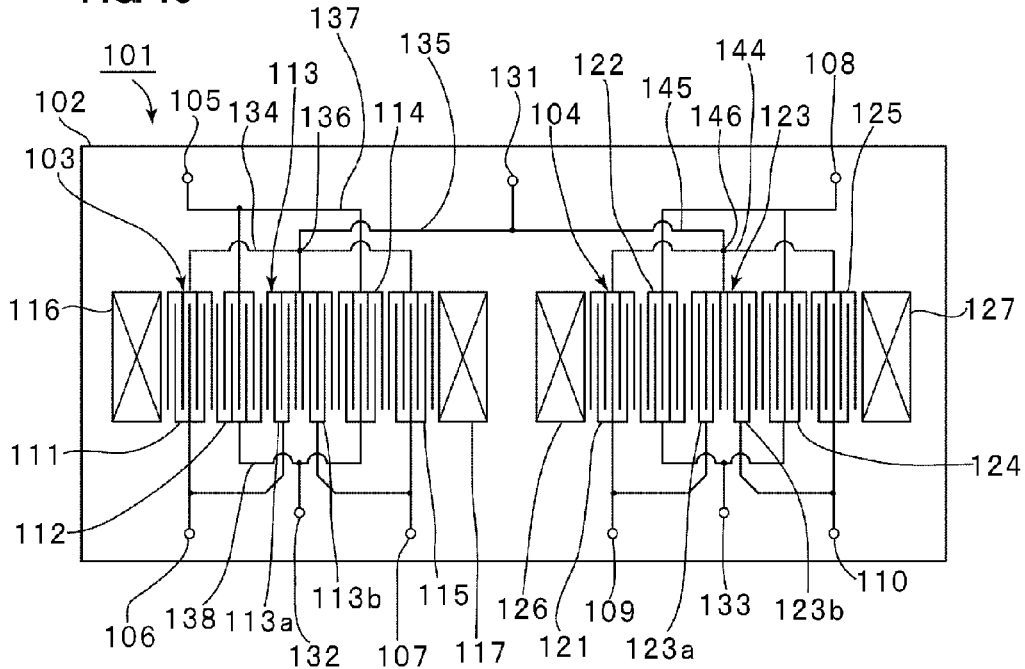
FIG. 16 is a schematic plan view of an acoustic wave filter device according to a second preferred embodiment of the present invention.

FIG. 16 is a schematic plan view of an acoustic wave filter device according to a second preferred embodiment of the present invention.

An acoustic wave filter device 101 according to the second preferred embodiment includes a piezoelectric substrate 102. The piezoelectric substrate 102 can be made of an appropriate piezoelectric single crystal or piezoelectric ceramic, similar to the piezoelectric substrate 2 in the first preferred embodiment. First and second acoustic wave filters 103 and 104 are formed by the construction of an illustrated electrode structure on the piezoelectric substrate 102. That is, the plurality of acoustic wave filters 103 and 104 are disposed on the single piezoelectric substrate 102.

In the present preferred embodiment, each of the first and second acoustic wave filters 103 and 104 preferably is a 5-IDT longitudinally-coupled resonator type acoustic wave filter. That is, the first acoustic wave filter 103 includes first to fifth IDTs 111 to 115 arranged in sequence in the surface acoustic wave propagation direction and reflectors 116 and 117 arranged at both sides of a section where the IDTs 111 to 115 are disposed in the surface acoustic wave propagation direction. Similarly, the longitudinally-coupled resonator type acoustic wave filter portion 104 includes first to fifth IDTs 121 to 125 arranged in sequence in the surface acoustic wave propagation direction and reflectors 126 and 127 arranged at both sides of a section where the IDTs 121 to 125 are disposed in the surface acoustic wave propagation direction.

The first acoustic wave filter 103 includes an unbalanced terminal 105 and first and second balanced terminals 106 and 107.

The second acoustic wave filter 104 includes an unbalanced terminal 108 and first and second balanced terminals 109 and 110. First to third ground terminals 131 to 133 are disposed on the piezoelectric substrate 102. Each of the ground terminals 131 to 133 corresponds to a terminal connected to an external ground potential. The ground terminal 131 is positioned adjacent to a second side of a section where the IDTs 111 to 115 and 121 to 125 are disposed, that is, the side at which the unbalanced terminals 105 and 108 are disposed. The ground terminals 132 and 133 are arranged adjacent to a second side of the region where the IDTs 111 to 115 and 121 to 125 are disposed, that is, the side at which the balanced terminals 106, 107, 108, 109, and 110 are disposed.

In the second preferred embodiment, first ends of the first IDT 111, third IDT 113, and fifth IDT 115 are commonly connected by a common connection line 134. The common connection line 134 is connected to a ground line 135 by a connection point 136. The ground line 135 is a line section that has a first end connected to the connection point 136 and a second end connected to the ground terminal 131, that is, an external ground potential.

The common connection line 134 is a line section that commonly connects the first ends of the IDTs 111, 113, and 115.

In the present preferred embodiment, the connection point 136 is positioned on an imaginary line passing through the center of the first acoustic wave filter 103 on the piezoelectric substrate 102 and extending along a direction perpendicular or substantially perpendicular to the acoustic wave propagation direction. Accordingly, the distance between the connection point 136 and the first balanced terminal 106 and the distance between the connection point 136 and the balanced terminal 107 are the same.

The third IDT 111 includes first and second partitioned IDT portions 113a and 113b being two portions into which it is partitioned in the acoustic wave propagation direction. The first IDT 111 and the first partitioned IDT portion 113a are commonly connected to the first balanced terminal 106. The second partitioned IDT portion 113b and the fifth IDT 115 are commonly connected to the second balanced terminal 107.

First ends of the second IDTs 112 and 114 are commonly connected to the unbalanced terminal 105 by a common connection line 137. Second ends of the second and fourth IDTs 112 and 114 are commonly connected to the second ground terminal 132 by a common connection line 138.

Similarly, also in the second acoustic wave filter portion 104, first ends of the first, third, and fifth IDTs 121, 123, and 125 are commonly connected by a common connection line 144. The common connection line 144 is connected to the ground terminal 131 by a ground line 145. The ground line 145 is connected at a connection point 146 to the common connection line 144. The connection point 146 is positioned on an imaginary line passing through the center of the second acoustic wave filter 104 on the piezoelectric substrate 102 and extending along a direction perpendicular or substantially perpendicular to the acoustic wave propagation direction. Accordingly, the distance between the connection point 146 and the first balanced terminal 109 and the distance between the connection point 146 and the second balanced terminal 110 are the same.

Also for the second acoustic wave filter 104, the third IDT 123 includes first and second partitioned IDT portions 123a and 123b. The first partitioned IDT portion 123a and the first IDT 121 are commonly connected to the first balanced terminal 109. The second partitioned IDT portion 123b and the fifth IDT 125 are commonly connected to the second balanced terminal 110. First ends of the second and fourth IDTs 122 and 124 are commonly connected to the unbalanced terminal 108, and second ends thereof are commonly connected to the third ground terminal 133 by a common connection line 148.

Also in the present preferred embodiment, for the first and second acoustic wave filters 103 and 104, the distance between the connection point 136 and the first balanced terminal 106 and the distance between the connection point 136 and the first balanced terminal 107 are the same, and the distance between the connection point 146 and the second balanced terminal 109 and the distance between the connection point 146 and the second balanced terminal 110 are the same. That is, for the first and second acoustic wave filters 103 and 104, the degree of symmetry of the line patterns connected to the ground potential at the side where the unbalanced terminal 108 is disposed is high. Therefore, for the first and second acoustic wave filters 103 and 104, it is possible to have an improved out-of-band attenuation.

Figure 17:
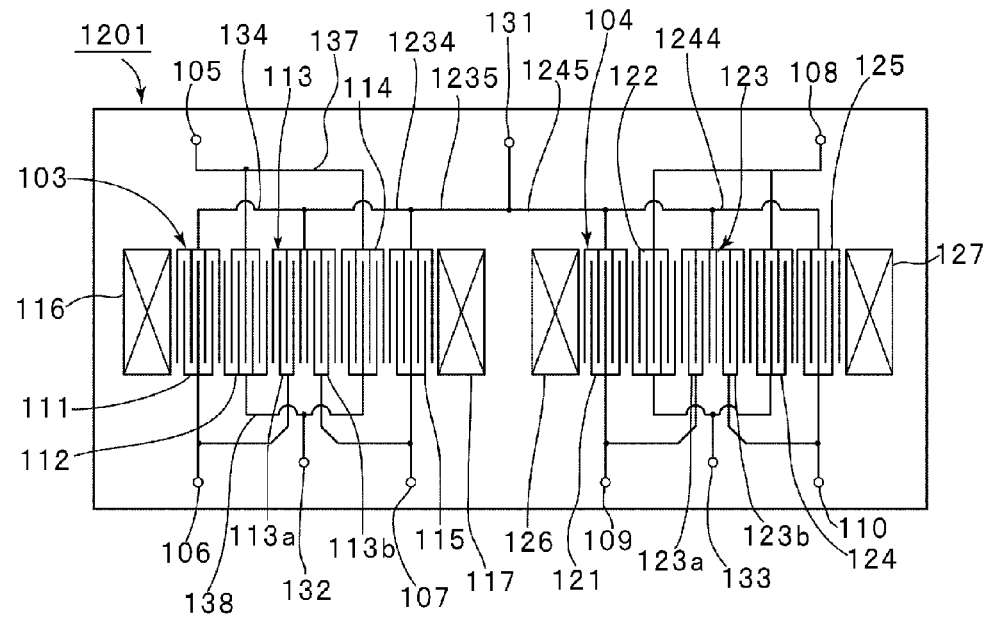
FIG. 17 is a schematic plan view of an acoustic wave filter device according to a second comparative example prepared for comparison with the second preferred embodiment of the present invention.

That is, for an acoustic wave filter device 1201 illustrated in FIG. 17 according to a second comparative example used in comparing with the acoustic wave filter device 101 according to the second preferred embodiment, in place of the common connection lines 134 and 144 and the ground lines 135 and 145, common connection lines 1234 and 1244 and ground lines 1235 and 1245 are preferably used. In this case, similar to the acoustic wave filter device 1101 according to the previously described comparative example, the out-of-band attenuation tends to deteriorate. In contrast to this, for the acoustic wave filter device 101 according to the second preferred embodiment, although the line patterns connected to the ground potential are slightly complicated, the use of the common connection lines 134 and 144 and the ground lines 135 and 145 can lead to improvement in the out-of-passband attenuation, similar to in the case of the first preferred embodiment.

In FIG. 16, similar to FIG. 1, which illustrates the first preferred embodiment, the electrode structure of the acoustic wave filter device is illustrated in a schematic plan view. Specifically, the electrode and line pattern sections can be arranged similar to the arrangement shown in FIG. 3, which illustrates the first preferred embodiment.

For each of the acoustic wave filter devices 1 and 101 according to the first and second preferred embodiments, in either case, the first and second, that is, the two longitudinally-coupled resonator type acoustic wave filters are disposed on the single piezoelectric substrate. In the present invention, three or more acoustic wave filters may also be disposed on the piezoelectric substrate.

It is preferable that, in all of the plurality of acoustic wave filters, in accordance with various preferred embodiments of the present invention, the distance between the connection point and the first balanced terminal and the distance between the connection point and the second balanced terminal be the same, or substantially the same. However, it is important only that, in at least one acoustic wave filter of the plurality of acoustic wave filters, the distance between the connection point and the first balanced terminal and the distance between the connection point and the second balanced terminal be the same, or substantially the same. This can lead to improvement in the out-of-passband attenuation in the acoustic wave filter having such a structure.

It is not necessarily required that all the plurality of acoustic wave filters be longitudinally-coupled resonator type acoustic wave filters. It is not necessarily required that all the acoustic wave filters have the balanced-to-unbalanced transforming function. That is, it is important only that at least one acoustic wave filter is a longitudinally-coupled resonator type acoustic wave filter having the balanced-to-unbalanced transforming function.

In any case, when a plurality of acoustic wave filters are disposed on a single piezoelectric substrate, a ground terminal connected to an external ground potential is often arranged between the plurality of acoustic wave filters. In such cases, in accordance with various preferred embodiments of the present invention, with respect to a ground terminal positioned adjacent to one side from an acoustic wave filter, as described above, in accordance with various preferred embodiments of the present invention, the enhancement in the degree of symmetry of the line pattern connected to the ground terminal in that acoustic wave filter can offer advantages of the present invention.

In the above-described preferred embodiments, a surface acoustic wave filter is preferably used, and a surface acoustic wave filter device is described. The present invention is also applicable to a boundary acoustic wave filter device that makes use of a boundary acoustic wave.

Figure 18:
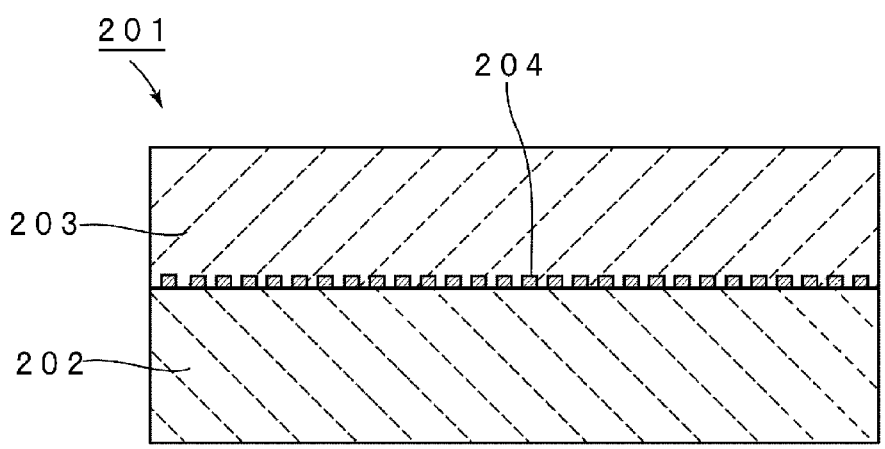
FIG. 18 is a schematic front cross-sectional view for use in describing a boundary acoustic wave device.
Figure 19:
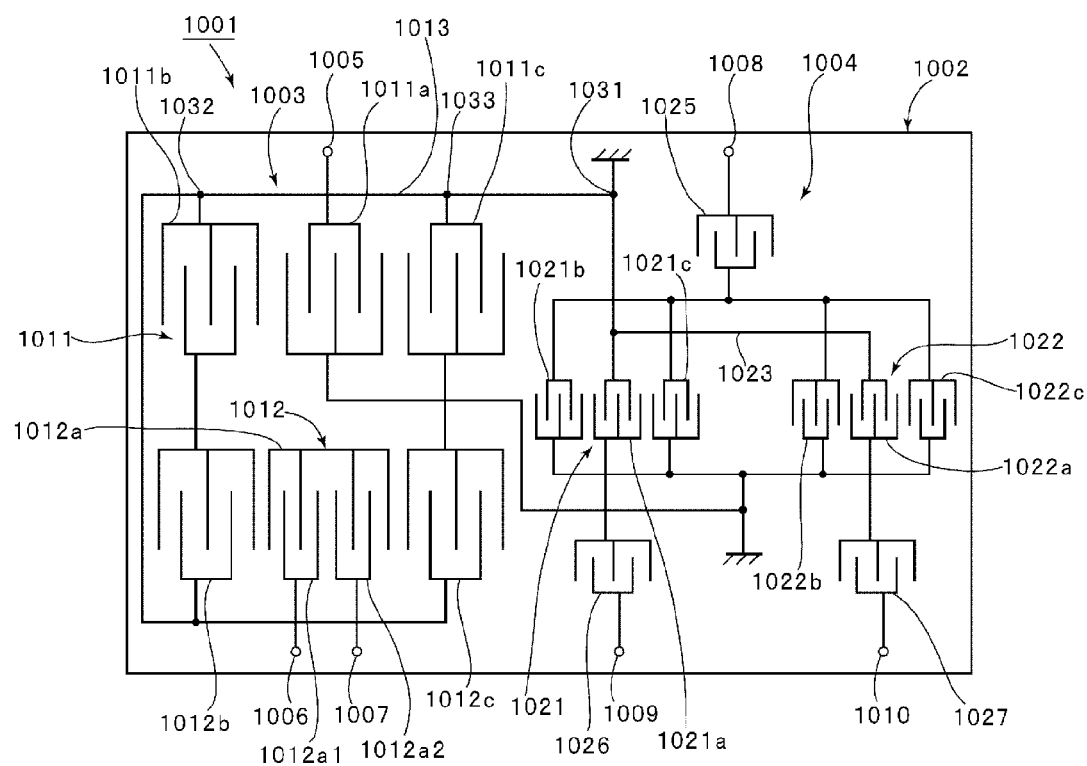
FIG. 19 is a schematic plan view of a traditional surface acoustic wave filter device.

FIG. 18 is a front cross-sectional view that schematically illustrates such a boundary acoustic wave filter device. That is, for a boundary acoustic wave device 201 illustrated in a simplified front cross-sectional view in FIG. 18, a dielectric 203 is placed on a piezoelectric substrate 202 made of a piezoelectric material. An electrode structure 204 containing IDTs is disposed in an interface between the piezoelectric substrate 202 and the dielectric 203. The formation of the electrode structure of any one of the above-described preferred embodiments as the electrode structure 204 can provide a boundary acoustic wave filter device in accordance with a preferred embodiment of the present invention.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An acoustic wave filter device comprising:
   a piezoelectric substrate; and
   a plurality of acoustic wave filters disposed on the piezoelectric substrate; wherein
   at least one acoustic wave filter of the plurality of acoustic wave filters is a 5-IDT longitudinally-coupled resonator type acoustic wave filter having a balanced-to-unbalanced transforming function and includes first to fifth IDTs arranged in sequence along an acoustic wave propagation direction, a pair of reflectors disposed at both ends of the first to fifth IDTs in the acoustic wave propagation direction, an unbalanced terminal, and first and second balanced terminals;
   the third IDT includes first and second divided IDT portions being two portions into which the third IDT is divided in the acoustic wave propagation direction;
   first ends of the second and fourth IDTs are commonly connected to the unbalanced terminal, and second ends thereof are connected to a ground potential via a first ground terminal;
   first ends of the first, third, and fifth IDTs are commonly connected to the ground potential via a second ground terminal;
   a second end of the first IDT and the first divided IDT portion are commonly connected to the first balanced terminal, and a second end of the fifth IDT and the second divided IDT portion are commonly connected to the second balanced terminal;
   the acoustic wave filter device further comprises:
      a common connection line arranged to commonly connect the first ends of the first, third, and fifth IDTs; and
      a ground line having a first end connected to the common connection line and a second end connected to the second ground terminal in order to connect the common connection line to the ground potential; and
   the common connection line is disposed on the piezoelectric substrate, and a connection point at which the ground line is connected to the common connection line is positioned such that a distance between the connection point and the first balanced terminal and a distance between the connection point and the second balanced terminal are the same or substantially the same.

2. The acoustic wave filter device according to claim 1, further comprising a mounting board on which the piezoelectric substrate is mounted, wherein the first and second ground terminals are respectively electrically connected to first and second ground electrodes connected to the ground potential on the mounting board.

3. The acoustic wave filter device according to claim 1, wherein each of the plurality of acoustic wave filters disposed on the piezoelectric substrate has the balanced-to-unbalanced transforming function and includes respective first and second balanced terminals and a respective connection point, and, in each of the acoustic wave filters, a distance between the respective connection point and the respective first balanced terminal and a distance between the respective connection point and the respective second balanced terminal are the same or substantially the same.

4. The acoustic wave filter device according to claim 1, wherein the plurality of acoustic wave filters are first and second acoustic wave filters having different passbands.

5. The acoustic wave filter device according to claim 4, wherein the first acoustic wave filter is a reception band-pass filter for use in an RF stage of a cellular phone, and the second acoustic wave filter is a transmission band-pass filter.

6. The acoustic wave filter device according to claim 1, wherein the acoustic wave is a surface acoustic wave, and thus the acoustic wave filter device is a surface acoustic wave filter device.

7. The acoustic wave filter device according to claim 1, further comprising a dielectric layer disposed on the piezoelectric substrate, wherein the acoustic wave is a boundary acoustic wave, and thus the acoustic wave filter device is a boundary acoustic wave filter device.

* * * * *